(12) United States Patent
Tanaka et al.

(10) Patent No.: US 6,922,428 B2
(45) Date of Patent: Jul. 26, 2005

(54) GAS LASER APPARATUS FOR LITHOGRAPHY

(75) Inventors: Satoshi Tanaka, Tochigi (JP); Kouji Kakizaki, Tochigi (JP); Youichi Sasaki, Tochigi (JP)

(73) Assignee: Gigaphoton Inc., Tokyo (JP)

( * ) Notice: Subject to any disclaimer, the term of this patent is extended or adjusted under 35 U.S.C. 154(b) by 0 days.

(21) Appl. No.: 10/394,473

(22) Filed: Mar. 20, 2003

(65) Prior Publication Data

US 2004/0047384 A1 Mar. 11, 2004

Related U.S. Application Data

(63) Continuation of application No. 09/798,699, filed on Mar. 2, 2001, now abandoned.

(51) Int. Cl.[7] .............. H01S 3/22; H01S 3/09
(52) U.S. Cl. ............... 372/55; 372/57; 372/58; 372/59; 372/60; 372/90
(58) Field of Search .............. 372/55, 57, 58, 372/59, 60, 76, 90

(56) References Cited

U.S. PATENT DOCUMENTS

| 4,387,462 A | * | 6/1983 | Markus ..................... 372/32 |
| 5,962,857 A | | 10/1999 | McKeever et al. |
| 6,014,398 A | | 1/2000 | Hofmann et al. |
| 6,064,072 A | | 5/2000 | Partlo et al. |
| 6,188,710 B1 | * | 2/2001 | Besaucele et al. ............ 372/60 |
| 6,584,131 B1 | * | 6/2003 | Kakizaki ..................... 372/57 |

* cited by examiner

Primary Examiner—Minsun Oh Harvey
Assistant Examiner—Armando Rodriguez
(74) Attorney, Agent, or Firm—Dellett & Walters

(57) ABSTRACT

The present invention relates to a long pulse gas laser apparatus for lithography further improved in the laser oscillation efficiency and stability increased by addition of xenon gas. A gas laser apparatus for lithography has a pair of discharge electrodes 2 provided in a laser chamber 1 and emits laser beam having a laser pulse width ($T_{is}$) of not less than 40 ns by exciting a laser gas sealed in the laser chamber 1 by electric discharge between the pair of discharge electrodes 2, the laser gas containing xenon in an amount not less than 2 ppm and not more than 100 ppm in partial pressure ratio. The laser gas has been heated at least when the laser beam is emitted.

16 Claims, 8 Drawing Sheets

GAS LASER APPARATUS FOR LITHOGRAPHY

This application is continuation of Ser. No. 09/798,699 filed Mar. 2, 2001, now abandoned.

BACKGROUND OF THE INVENTION

The present invention relates to gas laser apparatus for lithography and, more particularly, to gas laser apparatus for lithography, e.g. KrF excimer laser apparatus, ArF excimer laser apparatus, or fluorine laser apparatus With the achievement of small, fine and high-integration semiconductor integrated circuits, it has been demanded that exposure systems for the manufacture of such highly integrated circuits be improved in resolution. Under these circumstances, the wavelength of exposure light emitted from light sources for lithography is becoming shorter, and gas laser apparatus emitting light shorter in wavelength than light emitted from conventional mercury lamps are used as light sources for semiconductor lithography. At present, KrF excimer laser apparatus that emit ultraviolet radiation of wavelength 248 nm are used as the gas laser apparatus for lithography. In addition, ArF excimer laser apparatus emitting ultraviolet radiation of wavelength 193 nm and fluorine ($F_2$) laser apparatus emitting ultraviolet radiation of wavelength 157 nm are promising as next-generation light sources for semiconductor lithography.

In the KrF excimer laser apparatus, a mixed gas of fluorine ($F_2$) gas, krypton (Kr) gas and a rare gas as a buffer gas, e.g. neon, is used as a laser gas, which is a laser medium. In the ArF excimer laser apparatus, a mixed gas of fluorine ($F_2$) gas, argon (Ar) gas and a rare gas as a buffer gas, e.g. neon, is used as a laser gas. In the fluorine laser apparatus, a mixed gas of fluorine ($F_2$) gas and a rare gas as a buffer gas, e.g. helium (He) or/and neon (Ne), is used as a laser gas. In these apparatus, the laser gas as a laser medium, which is in the form of a mixed gas, is sealed in a laser chamber under several hundred kPa and excited by generating an electric discharge in the laser chamber.

More specifically, in the laser chamber, a pair of main discharge electrodes for exciting the laser gas are disposed to face each other at a predetermined distance in a direction perpendicular to the laser oscillation direction. A high-voltage pulse is applied between the pair of main discharge electrodes. When the voltage across the main discharge electrodes reaches a certain value (breakdown voltage), a dielectric breakdown occurs in the laser gas between the main discharge electrodes, and thus a main discharge starts. The laser medium is excited by the main discharge.

Accordingly, such gas laser apparatus for lithography perform pulsed laser oscillation by repetition of the main discharge and emit pulsed laser beam. At the present state of the art, the laser pulse repetition rate is 2 kHz or higher.

Gas laser apparatus for lithography are characterized in that because the oscillation pulse width ($T_{is}$) is usually about 20 ns, the peak power of the output light is large, and that because the wavelength of the output light is short, the photon energy is high. Here, $T_{is}$ is used as the laser oscillation pulse width.

Assuming that the deterioration of optical elements is caused by the two-photon absorption of laser light, the damage to the optical system is known to be in inverse proportion to $T_{is}$ under the same laser energy conditions. $T_{is}$ is defined by $$T_{is}=[\int P(t)dt]^2/\int P(t)^2 dt \quad (1)$$

where P(t) is the laser intensity depending upon time t.

Therefore, it is demanded that the laser pulse width $T_{is}$ be stretched to achieve a longer pulse width as one method for reducing the damage to an optical system mounted in an exposure system. The achievement of a longer pulse width is also demanded from the following points of view.

In a projection exposure system, an image of a mask provided with a circuit pattern or the like is projected through a projection lens onto a work, e.g. a wafer, coated with a photoresist. The resolution R of the projected image and the depth of focus DOF are expressed by $$R=k_1\lambda/NA \quad (2)$$

$$DOF=k_2\lambda/(NA)^2 \quad (3)$$

where $k_1$ and $k_2$ are coefficients reflecting the characteristics of the resist and so forth; $\lambda$ is the wavelength of exposure light emitted from a light source for lithography; and NA is a numerical aperture.

To improve the resolution R, the wavelength of exposure light is reduced, and the NA is increased, as will be clear from Eq. (2). However, the depth of focus DOF decreases correspondingly, as shown by Eq. (3). Consequently, the influence of chromatic aberration increases. Therefore, it is necessary to further narrow the spectral linewidth of exposure light. In other words, it is demanded that the spectral linewidth of laser beam emitted from the gas laser apparatus for lithography be further narrowed.

It is stated in Proc. SPIE Vol. 3679.(1999) 1030–1037 that according as the laser pulse width increases, the spectral linewidth of laser beam narrows. This was actually proved by an experiment conducted by the present inventors. In other words, it is demanded in order to improve the resolution R that the spectral linewidth of laser beam be further narrowed. For this purpose, it is essential to further stretch the pulse width of laser beam.

In regard to the above-described gas laser apparatus for lithography, a technique has heretofore been proposed whereby a predetermined amount of a rare gas (e.g. xenon: Xe) different in kind from the rare gas in the laser gas is added to the laser gas to improve energy stability between the pulses of emitted laser beam and to increase the laser output.

More specifically, Japanese Gazette Containing the Pat. No. 3,046,955 states that less than 100 ppm of an additional gas (e.g. less than 10 ppm of oxygen and a certain amount of a rare gas (Xe or the like) heavier than the rare gas in the laser gas) is added to the laser gas sealed in the laser chamber of a KrF excimer laser apparatus or an ArF excimer laser apparatus to improve the energy stability.

Further, it is stated in Japanese Patent Application Unexamined Publication (KOKAI) Nos. 2000-261074, 2000-261075, 2000-261082 and 2000-294856 that if a predetermined amount of xenon gas is added to a laser gas, burst characteristics and spike characteristics are improved. That is, in a burst operation in which a continuous pulse oscillating operation for a predetermined period of time and oscillation suspension for a predetermined period of time are repeated, it is possible to improve burst characteristics in which the energy is high at the beginning and gradually reduces thereafter. It is also possible to improve spike characteristics in which the energy is high at the beginning of each continuous pulse oscillating operation and gradually reduces thereafter.

As stated above, it is known that addition of xenon to the excimer laser gas allows an improvement in laser performance, e.g. energy stability. To further increase exposure systems in performance and to increase the lifetime of gas laser apparatus for lithography, however, it is demanded that the gas laser apparatus for lithography be improved to provide a higher output and to exhibit higher stability, and further, the laser pulse width of laser beam emitted therefrom be further stretched.

Under the above-described circumstances, the present inventors took notice of the temperature of the laser gas at the time of adding xenon thereto and obtained laser characteristic data under various temperature conditions. As a result, we found that the laser characteristics are highly dependent upon the temperature conditions.

SUMMARY OF THE INVENTION

The present invention was made in view of the above-described circumstances. An object of the present invention is to provide a long pulse gas laser apparatus for lithography improved over the prior art in the effects of the addition of xenon gas.

A gas laser apparatus for lithography according to the present invention provided to attain the above-described object has a pair of discharge electrodes for excitation provided in a laser chamber having a laser gas sealed therein and emits laser beam having a laser pulse width ($T_{is}$) of not less than 40 ns.

The gas laser apparatus for lithography is characterized in that the temperature of the laser gas before addition of xenon is not less than 35° C., and xenon is added to the laser gas at not less than 35° C. in an amount not less than 2 ppm and not more than 100 ppm in partial pressure ratio.

In this case, it is desirable that the temperature of the laser gas before addition of xenon be not less than 40° C., more preferably not less than 45° C., and xenon be added to the laser gas in an amount not less than 2 ppm and not more than 100 ppm in partial pressure ratio.

Another gas laser apparatus for lithography according to the present invention has a pair of discharge electrodes for excitation provided in a laser chamber having a laser gas sealed therein and emits laser beam having a laser pulse width ($T_{is}$) of not less than 40 ns.

The gas laser apparatus for lithography is characterized in that the temperature of the laser chamber is raised to not less than 35° C. by heating, and thereafter, a laser gas containing xenon in an amount not less than 2 ppm and not more than 100 ppm in partial pressure ratio is sealed in the laser chamber.

In this case, it is desirable that the temperature of the laser chamber be raised to not less than 40° C., more preferably not less than 45° C., by heating.

Still another gas laser apparatus for lithography according to the present invention has a pair of discharge electrodes for excitation provided in a laser chamber having a laser gas sealed therein and emits laser beam having a laser pulse width ($T_{is}$) of not less than 40 ns.

The gas laser apparatus for lithography is characterized in that xenon is added to the laser gas in an amount not less than 2 ppm and not more than 100 ppm in partial pressure ratio, and the temperature of the laser gas after the addition of xenon is not less than 35° C.

In this case, it is desirable that the temperature of the laser gas after the addition of xenon be not less than 40° C., more preferably not less than 45° C.

A further gas laser apparatus for lithography according to the present invention has a pair of discharge electrodes provided in a laser chamber and emits laser beam having a laser pulse width ($T_{is}$) of not less than 40 ns by exciting a laser gas sealed in the laser chamber by electric discharge between the pair of discharge electrodes, the laser gas containing at least xenon in an amount not less than 2 ppm and not more than 100 ppm in partial pressure ratio.

The gas laser apparatus for lithography is characterized in that the laser gas has been heated at least when the laser beam is emitted.

In this case, it is desirable that the gas laser apparatus have preionization means for preionizing the laser gas.

It is also desirable that the laser gas should have been heated to not less than 35° C., more preferably not less than 40° C., even more preferably not less than 45° C., when laser beam is emitted.

The foregoing gas laser apparatus may be arranged to perform a laser oscillating operation by the first half-cycle of the discharge oscillating current waveform of one pulse in which the polarity is reversed, together with at least two half-cycles subsequent to the first half-cycle.

The foregoing gas laser apparatus for lithography according to the present invention may be a KrF excimer laser apparatus, an ArF excimer laser apparatus, or a fluorine laser apparatus, for example.

According to the present invention, in a gas laser apparatus for lithography that emits laser beam having a laser pulse width ($T_{is}$) of not less than 40 ns, the laser gas containing xenon has been heated when laser beam is emitted. Therefore, it is possible to increase the output energy and the degree of stability in the second half of each laser pulse. Thus, the laser pulse width is further stretched, and a reduction in the peak power and narrowing of the bandwidth are realized. In addition, the laser oscillation efficiency is improved. Therefore, the chamber lifetime is extended owing to the reduction in the input energy, which makes laser operating cost reduced. Further, because the energy in the second half of each laser pulse is stabilized, energy stability per pulse is improved, and exposure dose controllability is also improved.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

The gas laser apparatus for lithography according to the present invention will be described below on the basis of embodiments.

Figure 1:
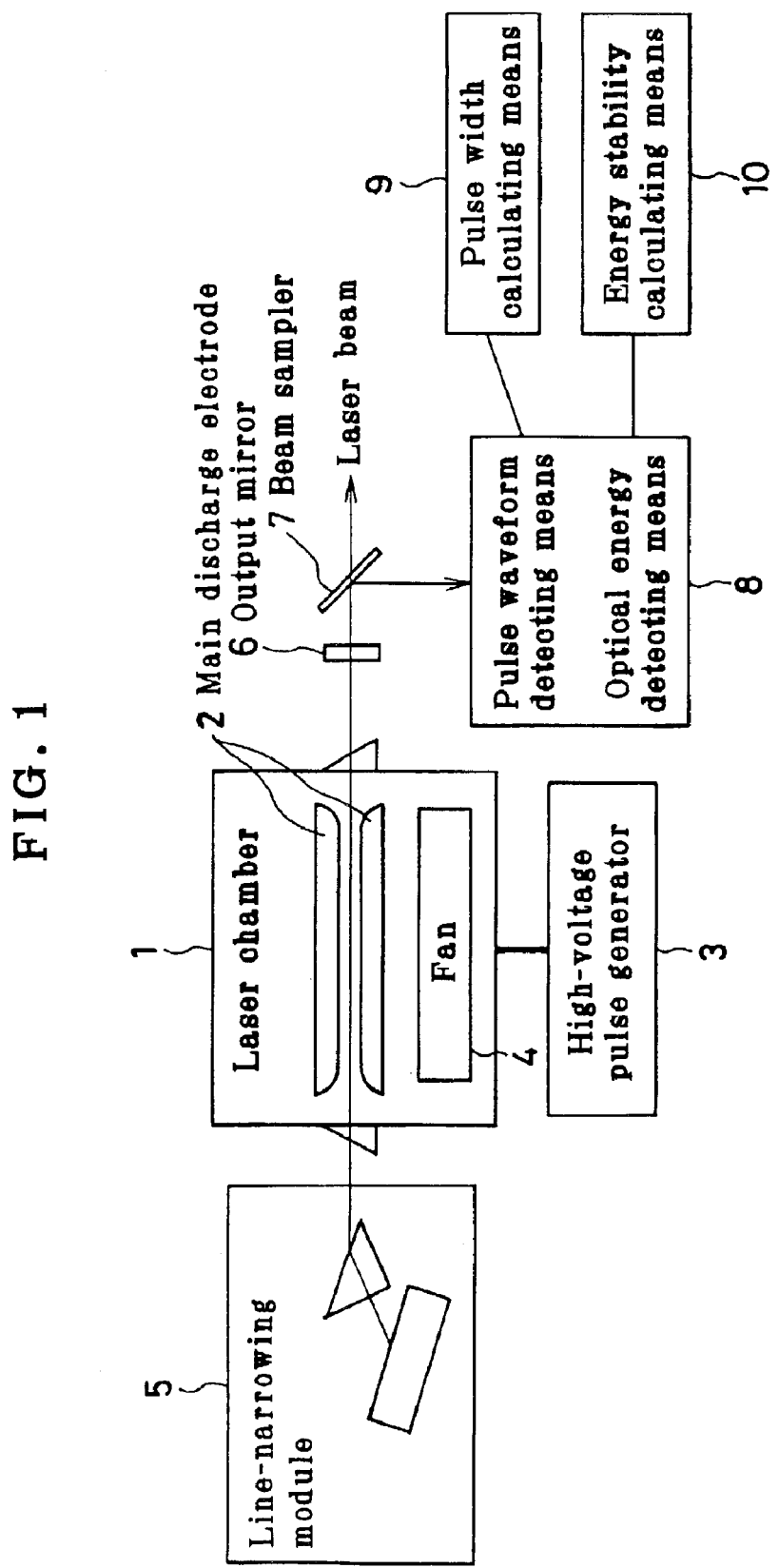
FIG. 1 is a diagram showing a structural example of the gas laser apparatus for lithography according to the present invention.

A structural example of the gas laser apparatus for lithography is shown in FIG. 1. A laser chamber 1 having windows provided at both ends thereof is filled with a laser gas having a predetermined composition ratio. A pair of main discharge electrodes 2 for exciting the laser gas are disposed in the laser chamber 1 to face each other in a direction perpendicular to the laser oscillation direction. A high-voltage pulse generator 3 applies a high-voltage pulse between the main discharge electrodes 2 to generate an electric discharge therebetween, thereby exciting the laser gas to generate fluorescent light, which induces laser oscillation.

It should be noted that the laser gas is forced to circulate in the laser chamber 1 by rotation of a fan 4 provided in the laser chamber 1 to remove ionized substances generated by electric discharge from the discharge space before the subsequent electric discharge in a high-repetition rate oscillating operation. By the laser gas circulation, the laser gas between the main discharge electrodes 2 is replaced with a new gas after the generation of an electric discharge before the generation of the subsequent electric discharge. Therefore, the subsequent electric discharge is allowed to be a stable discharge.

The present inventors improved the laser gas circulating structure in the laser chamber 1, the configuration of the fan 4 and so forth to realize a repetition rate of 2 kHz or higher.

The fluorescent light generated by the electric discharge reciprocates between a line-narrowing module 5 and an output mirror 6 while undergoing selection of a predetermined wavelength by a line-narrowing optical system provided in the line-narrowing module 5. In this way, laser oscillation takes place, and the resulting laser beam is taken out from the output mirror 6. It should be noted that the line-narrowing optical system comprises, for example, a beam expanding optical system, which is formed from one or more prisms, and a Littrow mounting reflection type diffraction grating.

A part of the laser beam taken out from the output mirror 6 is split by a beam sampler 7 and led to a waveform detecting means for detecting the temporal waveform of the laser beam and also to an optical energy detecting means 8 for detecting the energy of the laser beam. Waveform data obtained by the waveform detecting means is sent to a pulse width calculating means 9. Energy data obtained by the optical energy detecting means is sent to an energy stability calculating means 10. The pulse width calculating means 9 calculates a laser pulse width $T_{is}$ according to the above-described Eq. (1) on the basis of the received pulse width data. The energy stability calculating means 10 calculates the degree of stability a from the received energy data.

Figure 2:
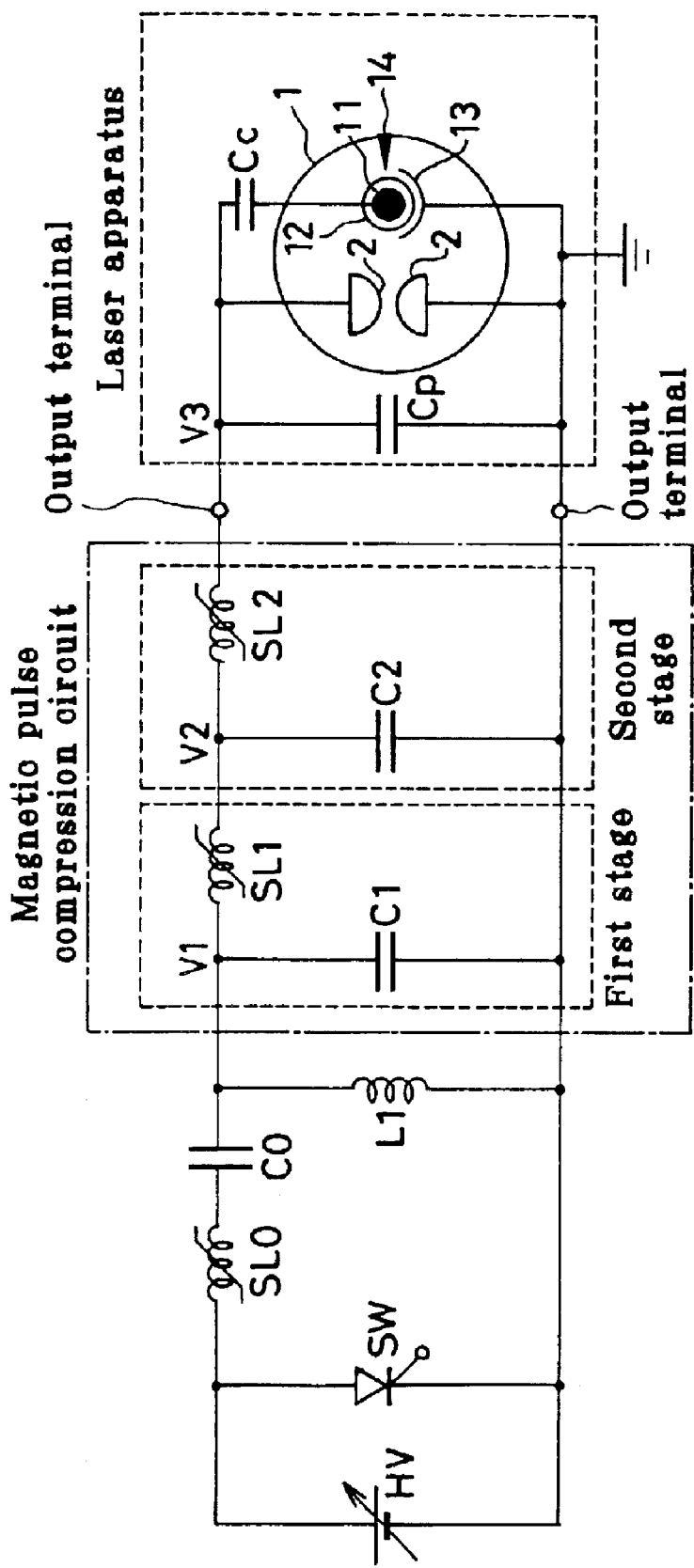
FIG. 2 is a diagram showing an example of a discharge circuit in the gas laser apparatus for lithography shown in FIG. 1.

A discharge circuit as shown in FIG. 2 applies a main discharge voltage between the main discharge electrodes 2 of the above-described gas laser apparatus and also applies a predischarge voltage between electrodes 11 and 13 of a corona preionization unit 14 through a capacitor $C_c$ for preionization. It should be noted that the corona preionization unit 14 in this example is arranged as follows. For example, the first electrode 11 is formed from a circular column-shaped electrode inserted into a tube 12, one side of which is open. The tube 12 is made of a dielectric material, e.g. high-purity alumina ceramics. The second electrode 13 is formed from a rectangular plate-shaped electrode. The plate-shaped member, which constitutes the second electrode 13, is bent in the vicinity of a straight edge thereof. The edge of the second electrode 13 is placed parallel to and in line contact with the outer surface of the dielectric tube 12, which constitutes the first electrode 11. The position at which the edge of the second electrode 13 contacts the outer surface of the dielectric tube 12 is set at a position from which the laser excitation space between the main discharge electrodes 2 is visible.

The circuit for generating a high-voltage pulse is a two-stage magnetic pulse compression circuit as shown in FIG. 2, which uses three magnetic switches SL0, SL1 and SL2 formed from saturable reactors, respectively. The magnetic switch SL0 protects a solid-state switch SW. The first magnetic switch SL1 and the second magnetic switch SL2 constitute a two-stage magnetic pulse compression circuit.

The arrangement and operation of the circuit will be described below with reference to FIG. 2. First, the voltage of a high-voltage power supply HV is adjusted to a predetermined value, and a main capacitor C0 is charged through the magnetic switch SL0 and an inductance L1. At this time, the solid-state switch SW is OFF. Upon completion of the charging of the main capacitor C0, the solid-state switch SW turns ON. At this time, the voltage across the solid-state switch SW shifts so as to be applied across the magnetic switch SL0, thereby protecting the solid-state switch SW. When the time integration value of the charging voltage V0 across the main capacitor C0, which is applied across the magnetic switch SL0, reaches a critical value determined by the characteristics of the magnetic switch SL0, the magnetic switch SL0 is saturated to turn ON. Consequently, an electric current flows through a loop formed by the main capacitor C0, the magnetic switch SL0, the solid-state switch SW and a capacitor C1. As a result, the electric charge stored in the main capacitor C0 is transferred to and stored in the capacitor C1.

Thereafter, when the time integration value of the voltage V1 across the capacitor C1 reaches a critical value determined by the characteristics of the magnetic switch SL1, the magnetic switch SL1 is saturated to turn ON. Consequently, an electric current flows through a loop formed by the capacitor C1, a capacitor C2 and the magnetic switch SL2. As a result, the electric charge stored in the capacitor C1 is transferred to and stored in the capacitor C2.

Thereafter, when the time integration value of the voltage V2 across the capacitor C2 reaches a critical value determined by the characteristics of the magnetic switch SL2, the magnetic switch SL2 is saturated to turn ON. Consequently, an electric current flows through a loop formed by the capacitor C2, a peaking capacitor Cp and the magnetic switch SL2. As a result, the electric charge stored in the capacitor C2 is transferred to and stored in the peaking capacitor Cp.

As will be clear from the description given in connection with FIG. 2, a corona discharge for preionization occurs at the outer peripheral surface of the dielectric tube 12, starting from the position at which the second electrode 13 contacts the dielectric tube 12. More specifically, as the charging of the peaking capacitor Cp, which is shown in FIG. 2, proceeds, the voltage V3 across the peaking capacitor Cp increases. When the voltage V3 reaches a predetermined value, a corona discharge occurs at the surface of the dielectric tube 12 of the corona preionization unit. The corona discharge causes ultraviolet radiation to be generated at the surface of the dielectric tube 12. The ultraviolet radiation preionizes the laser gas flowing between the main discharge electrodes 2 as a laser medium.

As the charging of the peaking capacitor Cp further proceeds, the voltage V3 across the peaking capacitor Cp increases. When the voltage V3 reaches a certain value (breakdown voltage) Vb, an electric breakdown occurs in the laser gas between the main discharge electrodes 2, and thus a main discharge starts. The laser medium is excited by the main discharge, and laser beam is generated.

Thereafter, the voltage across the peaking capacitor Cp lowers rapidly owing to the main discharge, and eventually returns to the state before the start of charging.

The above-described discharging operation is repeated by the switching operation of the solid-state switch SW, whereby pulsed laser oscillation is performed at a predetermined repetition rate.

Thus, a combination of the magnetic switch SL1 and the capacitor C1 forms a capacitive transfer circuit constituting a first stage, and a combination of the magnetic switch SL2 and the capacitor C2 forms a capacitive transfer circuit constituting a second stage. By setting the inductance of each capacitive transfer circuit so that the inductance becomes smaller as the ordinal number of stages increases, a pulse compression operation is carried out such that the pulse width of an electric current pulse flowing through each stage narrows successively. Consequently, a strong discharge of short pulse is realized between the main discharge electrodes 2.

Figure 3:
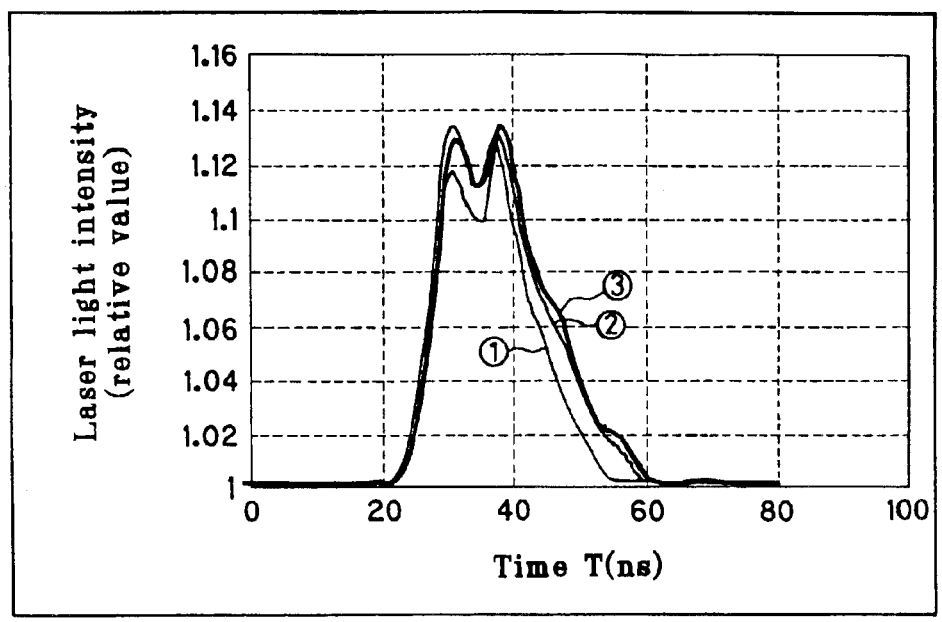
FIG. 3 is a diagram showing the effect of the addition of xenon and the laser gas temperature on the laser pulse waveform in a case where the laser pulse width is not stretched to achieve a longer pulse width.

We examined the relationship between the addition of xenon (Xe) to the laser gas and the laser gas temperature in a case where the above-described gas laser apparatus for lithography is not particularly arranged to stretch the pulse width as in the case of the conventional apparatus. FIG. 3 shows an example of a laser pulse waveform in a gas laser apparatus (ArF excimer laser apparatus) for lithography that is not particularly arranged to stretch the pulse width, i.e. which has a laser pulse width ($T_{is}$) of less than 40 nm under the conditions where the laser gas does not contain Xe and the laser gas temperature is 24° C. (① in FIG. 3).

Three different kinds of curves ①, ② and ③ drawn in FIG. 3 are as follows: Curve ① shows a laser pulse waveform under the conditions that the laser gas does not contain Xe and the laser gas temperature is 24° C. (hereinafter referred to as "conditions ①"); curve ② shows a laser pulse waveform under the conditions that the laser gas contains 10 ppm of Xe and the laser gas temperature is 24° C. (hereinafter referred to as "conditions ②"); and curve ③ shows a laser pulse waveform under the conditions that the laser gas contains 10 ppm of Xe and the laser gas temperature is 50° C. (hereinafter referred to as "conditions ③").

Under any of the three conditions, the laser pulse width ($T_{is}$) was less than 40 ns.

The area of the laser pulse waveform is equivalent to the laser output. As will be clear from FIG. 3, the laser output is larger under the conditions where Xe is added to the laser gas (conditions ② and ③) than under the conditions where Xe is not added to the laser gas (conditions ①). However, there is substantially no difference in the laser pulse waveform, i.e. in the laser output, between the conditions where Xe is added to the laser gas and the laser gas temperature is low (conditions ②) and the conditions where Xe is added to the laser gas and the laser gas temperature is high (conditions ③).

That is, the effects of the addition of Xe similar to those in the prior art are recognized in an ArF excimer laser apparatus not particularly arranged to stretch the pulse width, i.e. which has a laser pulse width ($T_{is}$) of less than 40 ns under the conditions where the laser gas does not contain Xe and the laser gas temperature is 24° C. However, substantially no effects of raising the temperature are recognized in such an ArF excimer laser apparatus.

The present inventors found that, in contrast to the prior art, the laser pulse waveform changes markedly in the second half of the waveform (i.e. in the second half of the laser oscillation) in an ArF excimer laser apparatus arranged to stretch the pulse width, i.e. which has a laser pulse width ($T_{is}$) of not less than 40 ns under the conditions where the laser gas does not contain Xe and the laser gas temperature is 50° C., if Xe is added to the laser gas and further the laser gas temperature is raised. The changes in the laser pulse waveform are shown in FIG. 4.

Figure 4:
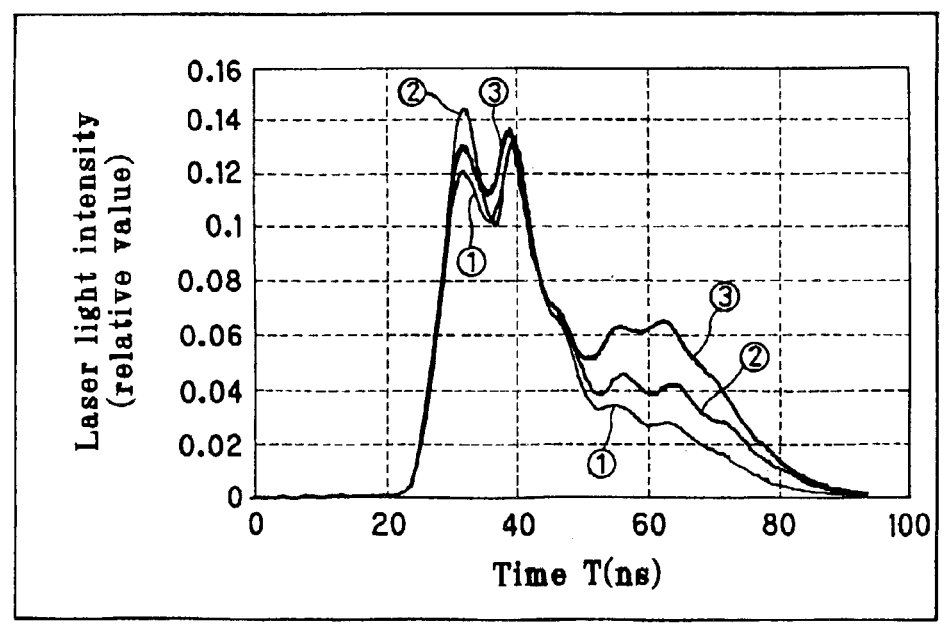
FIG. 4 is a diagram showing the effect of the addition of xenon and the laser gas temperature on the laser pulse waveform in an ArF excimer laser apparatus arranged to achieve a longer pulse width.

Three curves shown in FIG. 4 were obtained under three different conditions (conditions ①, conditions ② and conditions ③) similar to those in the case of FIG. 3. Under any of the three conditions, the laser pulse width ($T_{is}$) was not less than 40 ns.

As will be clear from FIG. 4, in comparison of the conditions (conditions ①) where the laser gas temperature is 24° C. and Xe is not added to the laser gas with the conditions (conditions ②) where the laser gas temperature is 24° C. and Xe is added to the laser gas, the laser pulse waveform is more protuberant and the laser output is larger under the conditions ② than under the conditions ① in both the first and second halves of the laser pulse waveform.

The above result is similar to that in the case of the foregoing ArF excimer laser apparatus that is not particularly arranged to stretch the pulse width. This also corresponds to a well-known technique in which the laser output is increased by adding a predetermined amount of Xe to the laser gas, as stated for example in Japanese Patent Application Unexamined Publication (KOKAI) No. 2000-294856.

Figure 6:
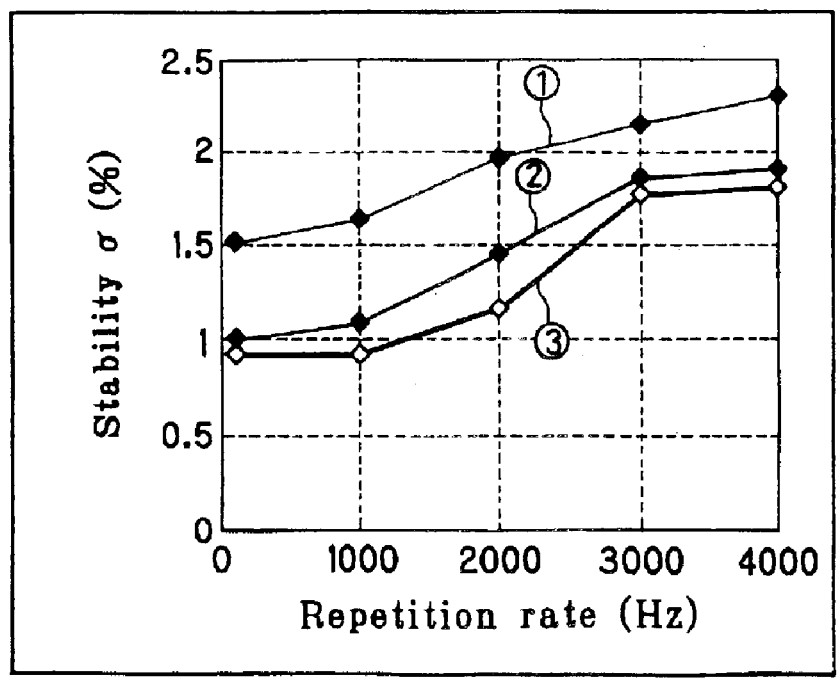
FIG. 6 is a diagram showing the effect of the addition of xenon and the laser gas temperature on stability characteristics with respect to the laser pulse repetition rate.

On the other hand, in comparison of the conditions (conditions ②) where Xe is added to the laser gas and the laser gas temperature is low (24° C.) with the conditions (conditions ③) where Xe is added to the laser gas and the laser gas temperature is high (50° C.), there is substantially no change in the laser pulse waveform with the rise in temperature in the first half of the laser pulse waveform. In the second half of the laser pulse waveform, however, the laser pulse waveform is markedly protuberant under the conditions ③ in comparison to that under the conditions ②. Thus, the laser output in the second half of the laser pulse waveform is larger under the conditions ③ than under the conditions ②. Further, as shown in FIG. 6, the stability of the laser pulse energy is more improved under the conditions ③ than under the conditions ②. It should be noted that the degree of stability a is defined by (standard deviation of each pulse energy)/(average of each pulse energy)×100%.

As will be clear from FIG. 4, it has become clear that raising the laser gas temperature as well as adding xenon (Xe) to the laser gas as in the present invention further improves the effects of increasing the laser output by adding a predetermined amount of xenon (Xe) to the laser gas, as has heretofore been known.

It should be noted that experiments conducted by the present inventors revealed that the effects of adding xenon (Xe) to the laser gas for lithography and, at the same time, raising the laser gas temperature according to the present invention are remarkable when the laser pulse width ($T_{is}$) is not less than 40 ns, and the effects obtained when the laser pulse width ($T_{is}$) is less than 40 ns are not so different from those obtained with the prior art. It was also revealed that the effects obtained by the present invention are particularly remarkable when the laser gas temperature is not less than 35° C., and the effects become greater as the laser gas temperature increases to 40° C. or 45° C., for example. On the other hand, when the laser gas temperature is less than 35° C., the effects are not so different from those obtained with the prior art.

Figure 5:
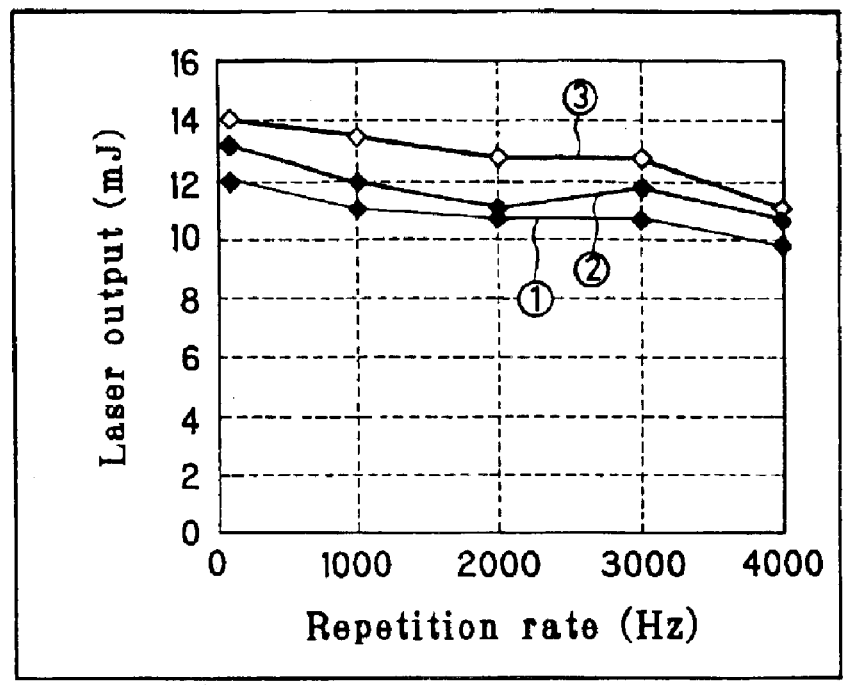
FIG. 5 is a diagram showing the effect of the addition of xenon and the laser gas temperature on laser output characteristics with respect to the laser pulse repetition rate.
Figure 7:
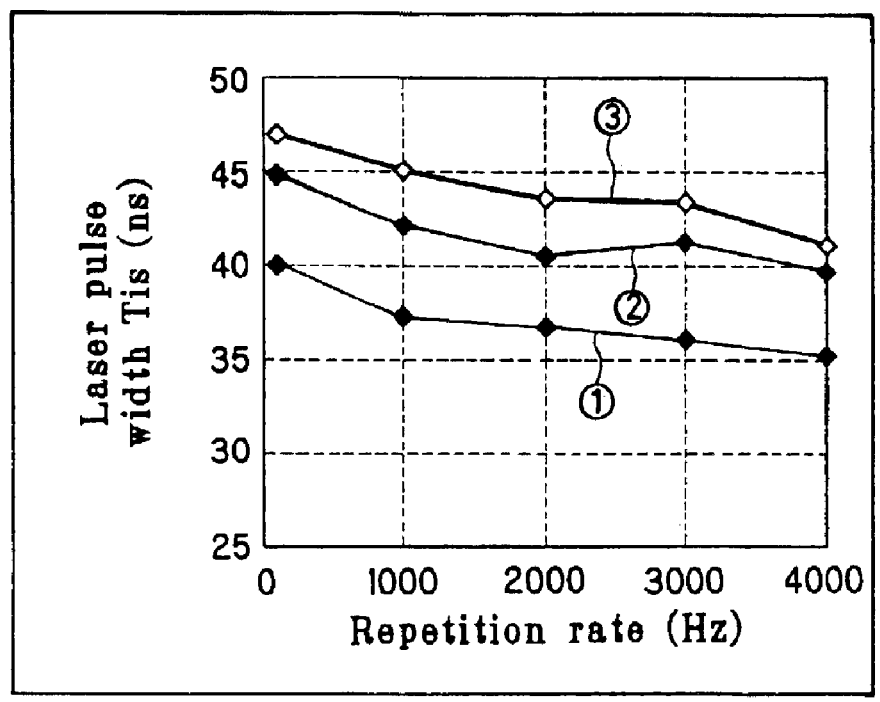
FIG. 7 is a diagram showing the effect of the addition of xenon and the laser gas temperature on laser pulse width ($T_{is}$) characteristics with respect to the laser pulse repetition rate.

FIG. 5 shows laser output characteristics with respect to the laser pulse repetition rate of a gas laser apparatus for lithography (ArF excimer laser apparatus) having a laser pulse width ($T_{is}$) of 40 ns under three different conditions similar to those in the case of FIG. 4: conditions ① where the laser gas does not contain Xe and the laser gas temperature is 24° C.; conditions ② where the laser gas contains 10 ppm of Xe and the laser gas temperature is 24° C.; and conditions ③ where the laser gas contains 10 ppm of Xe and the laser gas temperature is 50° C. FIG. 6 shows stability characteristics with respect to the laser pulse repetition rate of the same gas laser apparatus for lithography under the three conditions ①, ② and ③. FIG. 7 shows laser pulse width ($T_{is}$) characteristics with respect to the laser pulse repetition rate of the same gas laser apparatus for lithography under the three conditions ①, ② and ③.

As shown in FIG. 5, the laser output obtained under the conditions ③ is larger than under the conditions ① and ②. As shown in FIG. 6, the value of the stability a under the conditions ③ is smaller than under the conditions ① and ②. As shown in FIG. 7, the laser pulse width ($T_{is}$) under the conditions ③ is longer than under the conditions ① and ②.

In other words, as will be clear from FIGS. 5, 6 and 7, it is possible to improve the laser output characteristics, stability characteristics and laser pulse width ($T_{is}$) characteristics with respect to the laser pulse repetition rate by applying the technique of the present invention, wherein xenon (Xe) is added to the laser gas and the laser gas temperature is raised, to a gas laser apparatus for lithography arranged to stretch the pulse width, thereby increasing the laser output and improving the stability in the second half of each laser pulse, as shown in FIG. 4.

It is not necessarily clear why the second half of the laser pulse waveform is further increased by adding Xe to the laser gas and maintaining the laser gas temperature at not less than 35° C. in a gas laser apparatus for lithography arranged to stretch the laser pulse width ($T_{is}$) to not less than 40 ns. However, the reason may be surmised as follows.

Figure 8:
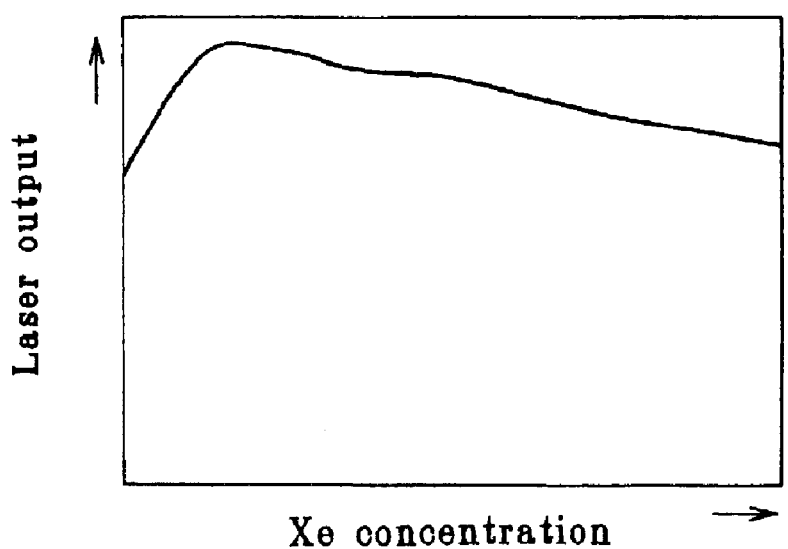
FIG. 8 is a diagram showing the change of the laser output with respect to the concentration of Xe in a laser gas.

FIG. 8 shows the change of the laser output with respect to the concentration of Xe in the laser gas. The laser output increases with the rise in the concentration of Xe in the laser gas. However, when the Xe concentration exceeds a certain level, the laser output reduces. The reason for this is deemed as follows. In a region where the Xe concentration is not in excess of the certain level, as the concentration of Xe in the laser gas increases, the laser output also increases owing to the amount of preionization increasing effects produced by the addition of Xe. However, in a region where the Xe concentration is in excess of the certain level, the loss of ultraviolet light due to absorption by Xe or a Xe compound (the term "ultraviolet light" as used herein means light of wavelength λ of the order of 100 nm used for preionization and light emission at the laser oscillation wavelength) exceeds the increase in the laser output caused by the increase of the preionization quantity. Consequently, the laser output reduces. In other words, it is necessary in order to optimize the laser output that the concentration of Xe in the laser gas be within a certain concentration range.

It is desirable that the amount of xenon (Xe) added to the laser gas be of the order of 2 to 100 ppm. The reason for this is as follows. Japanese Patent Application Unexamined Publication (KOKAI) No. 2000-294856 reveals that if the amount of Xe added to the laser gas is less than 2 ppm, the effect of easing the reduction in the laser output in a high-repetition frequency operation cannot substantially be obtained, whereas if the amount of Xe added to the laser gas is more than 100 ppm, the laser output itself is reduced. This has also been confirmed by experiments conducted by the present inventors.

Incidentally, because the atom of Xe is larger than other atoms in the laser gas, a part of Xe introduced into the laser chamber in a very small quantity is likely to be adsorbed on the laser chamber wall by van der Waals' forces (intermolecular forces). Xe may be adsorbed in either of two forms, i.e. Xe alone or a compound composed of Xe and a compound containing F. Therefore, when Xe is added to the laser gas to obtain an improvement in laser output stability and other effects, the conventional practice is to add Xe to the laser gas in excess of the required quantity by an amount corresponding to a reduction in Xe concentration due to the adsorption on the laser chamber wall, thereby optimizing the concentration of Xe in the laser gas.

If the laser operates in this state, Xe adsorbed on the laser chamber wall is desorbed upon obtaining energy exceeding a certain value by collision with active chemical species produced in the laser chamber by irradiation with the above-described ultraviolet light or electric discharge, and the desorbed Xe is released in the discharge space. A part of the desorbed Xe is adsorbed on the laser chamber wall again. For this reason, the concentration of Xe in the discharge space is deemed to be unstable.

The laser output and stability in the second half of the laser pulse waveform with a stretched pulse width depend strongly on the capability of sustaining stable electric discharge. One of factors that exert an influence upon the stable discharge sustainability is the number of preionized electrons increased by the addition of Xe to the laser gas. Accordingly, it is thought that the instability of the concentration of Xe present in the discharge space causes the electric discharge to become unstable, and the instability of the electric discharge causes the laser output to become unstable in the second half of each laser pulse.

For the reasons stated above, the adsorption of Xe added to the laser gas on the laser chamber wall is suppressed by previously raising the laser gas temperature to raise the temperature of the laser chamber wall surface in advance. Thus, it is possible to minimize the change of the Xe concentration by the lasing operation, and stable electric discharge is sustained even in the second half of the laser oscillation to generate laser light having a stretched pulse width. That is, it is deemed that in the case of the conditions ③ the above-described mechanism leads to an increase in the output and an improvement in stability in the second half of each laser pulse with a stretched pulse width.

Meanwhile, in the laser apparatus that is not particularly arranged to stretch the pulse width, the laser oscillation has already stopped in a time region corresponding to the above-described second half of each laser pulse. Therefore, even if the laser gas temperature is raised after the addition of Xe to the laser gas, there is no difference in the laser oscillation characteristics obtained when the laser gas temperature is raised and when it is not.

Although in the foregoing the ArF excimer laser apparatus is used as a gas laser apparatus for lithography, it is apparent that the above-described mechanism also holds true in KrF excimer laser apparatus and fluorine laser apparatus. Accordingly, the above-described effects can also be obtained in KrF excimer laser apparatus and fluorine laser apparatus.

Incidentally, the present inventors developed a method whereby the laser pulse width ($T_{is}$) of laser beam emitted from a gas laser apparatus for lithography is stretched to 40 ns or more. That is, the present inventors realized the stretch of the pulse width by arranging the gas laser apparatus for lithography shown in FIGS. 1 and 2 so that it performs a laser oscillating operation by the first half-cycle of the discharge oscillating current waveform of one pulse in which the polarity is reversed, together with at least two half-cycles subsequent to the first half-cycle.

Figure 9:
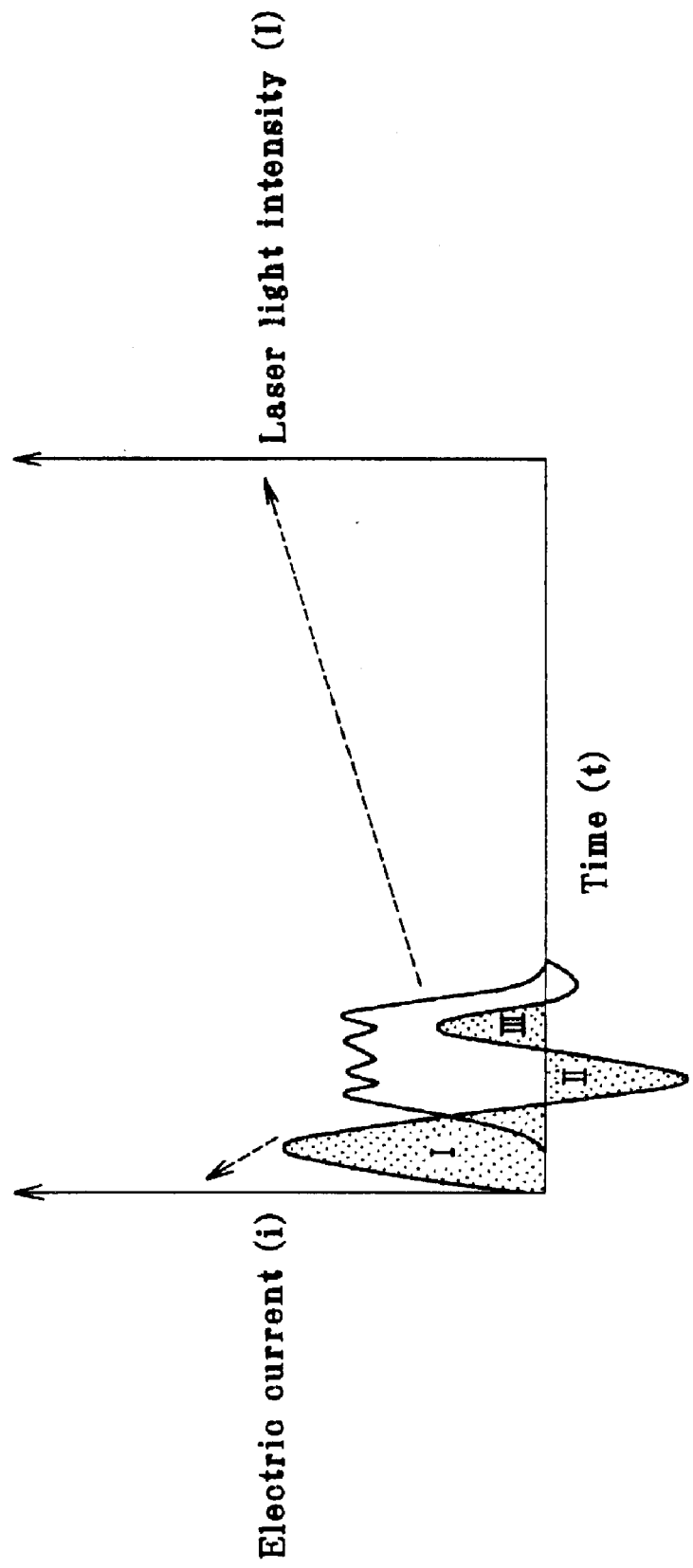
FIG. 9 is a schematic view showing the discharge current waveform and the laser pulse waveform in a case where a gas laser apparatus performs a laser oscillating operation by three or more half-cycles of the discharge oscillating current waveform.

FIG. 9 is a schematic view showing the discharge current waveform and the laser pulse waveform. The present inventors realized the stretch of the pulse width of laser light emitted from the gas laser apparatus for lithography by arranging the gas laser apparatus so that laser oscillation is continuously performed by the discharge current in half-cycles after the half-cycle I in FIG. 9, i.e. at least the half-cycles II and III, in addition to the half-cycle I.

More specifically, in order to allow laser oscillation to continue even after the first half-cycle of the oscillating current flowing between the main discharge electrodes 2 in FIG. 2, after which the polarity of the oscillating current is reversed, circuit constants are determined so that the peak value of the electric current is increased and, at the same time, the period of the oscillating current after the first half-cycle is shortened. That is, to increase the peak value of the oscillating current, the rise time of the voltage applied between the main discharge electrodes 2 is shortened so that the discharge starting voltage Vb becomes high. To shorten the period of the oscillating current, the loop (discharge current circuit) formed by the peaking capacitor Cp and the main discharge electrodes 2 in the exciting circuit shown in FIG. 2 is constructed so that the stray inductance in the loop is minimized. Further, the composition ratio, pressure and so forth of the laser gas in the laser chamber 1 are adjusted.

By the above-described mechanism, when the amount of Xe in the discharge part becomes unstable, electric discharge becomes spatially nonuniform owing to the concentration of electric discharge or the like when the polarity of the discharge current is reversed (I→II in FIG. 9), and energy that can be taken out as a laser output after the first half-cycle I decreases. Accordingly, although the stretch of the pulse width can be attained with the prior art, the energy in the second half of each laser pulse cannot satisfactorily be taken out as laser beam. Consequently, the output in the second half of each laser pulse is low, and the laser pulse width ($T_{is}$) is small.

The following is a description of the operation of the present invention in the gas laser apparatus for lithography arranged to stretch the pulse width as stated above. According to the foregoing mechanism, it is conceived that if the laser gas temperature is previously raised to raise the laser chamber wall surface temperature in advance, the adsorption of Xe added to the laser gas on the laser chamber wall is suppressed, and the change in the Xe concentration caused by the lasing operation can be minimized. Consequently, when the polarity of the discharge current is reversed (i.e. at the time of shifting from the half-cycle I to the half-cycle II of the oscillating current waveform shown in FIG. 9), the concentration of electric discharge or the like is less likely to occur than in a case where the laser gas temperature is not raised. Accordingly, uniform discharge is sustained even more favorably after the half-cycle I. Further, stable discharge is readily sustained even after the half-cycle II of the oscillating current. In other words, it is possible to increase the laser output and stability in the second half of each laser pulse.

Thus, the present invention provides a means whereby the laser output and stability can be further improved and the laser pulse width ($T_{is}$) can be further stretched by adding Xe to the laser gas and raising the laser gas temperature in the gas laser apparatus for lithography arranged to stretch the pulse width. It should be noted that the means according to the present invention is not necessarily limited in its application to a case where a longer pulse width is achieved by arranging the gas laser apparatus so that it performs a laser oscillating operation by the first half-cycle of the discharge oscillating current waveform of one pulse in which the polarity is reversed, together with at least two half-cycles subsequent to the first half-cycle. The above-described means is similarly applicable to any case where the discharge duration time is extended to achieve a longer pulse width, and similar advantageous effects can be obtained.

Incidentally, we found that the above-described effects of the present invention differ in the degree of effectiveness when the laser gas temperature is raised after Xe has been added to the laser gas and when Xe is added to the laser gas after the laser gas temperature has been raised. It should be noted that in the former case, the laser gas temperature was raised by heating the laser chamber with a heating means (not shown in FIG. 1). In the latter case also, raising the laser gas temperature before the addition of Xe was effected by heating the laser chamber with the heating means in the same manner as in the former case. It should be noted that in the latter case, Xe may be added after the preheated laser gas has been sealed in the laser chamber instead of heating the laser chamber with the heating means.

Figure 10:
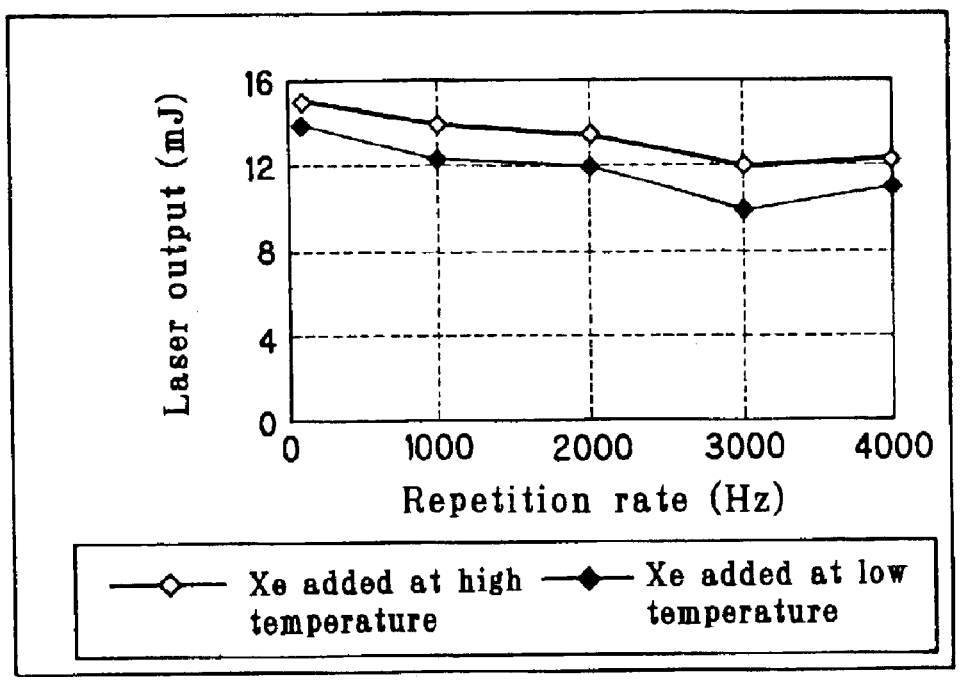
FIG. 10 is a diagram showing the effect of the sequential relationship between the Xe addition timing and the laser gas temperature raising timing on the repetition rate characteristics of the laser output.
Figure 11:
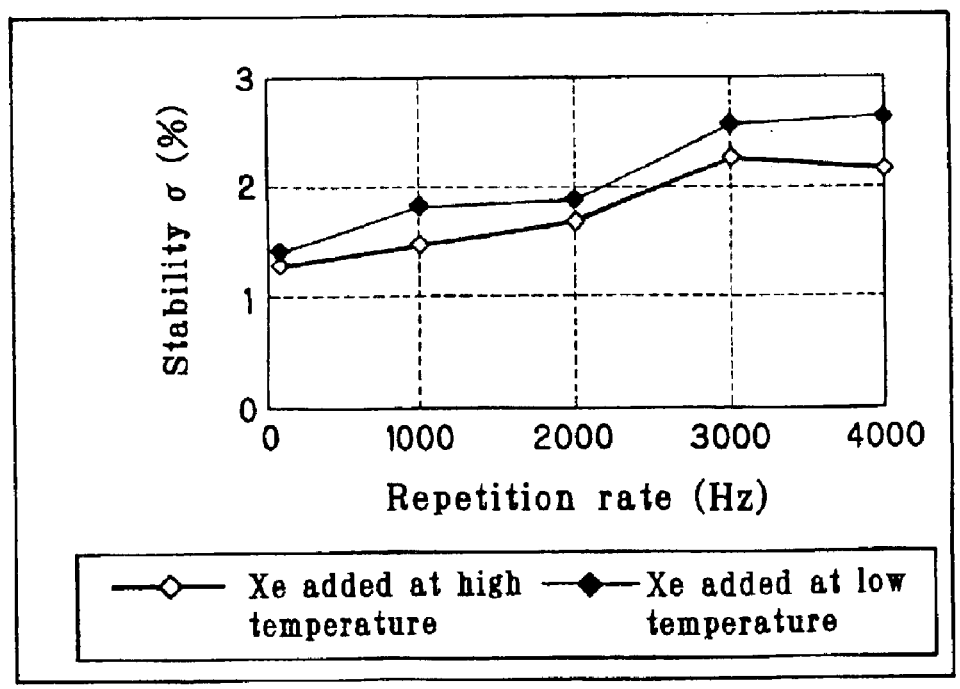
FIG. 11 is a diagram showing the effect of the sequential relationship between the Xe addition timing and the laser gas temperature raising timing on the repetition rate characteristics of the degree of stability.

FIG. 10 shows the repetition rate characteristic of the laser output in a case where the laser gas temperature is raised to 50° C. after 10 ppm of Xe has been added to the laser gas and in a case where 10 ppm of Xe is added to the laser gas after the laser gas temperature has been raised to 50° C. FIG. 11 shows the repetition rate characteristic of the degree of stability in the above-described two cases. It should be noted that the gas laser apparatus for lithography used in the experiments is an ArF excimer laser apparatus arranged to stretch the pulse width by performing a laser oscillating operation with the first half-cycle of the discharge oscillating current waveform of one pulse in which the polarity is reversed, together with at least two half-cycles subsequent to the first half-cycle, so that the laser pulse width ($T_{is}$) is 40 ns or more when the Xe has not yet been added to the laser gas.

As will be clear from FIGS. 10 and 11, the addition of Xe after raising the laser gas temperature provides greater effects than the addition of Xe before raising the laser gas temperature. The reason for this is not clear but may be as follows.

In a state where the laser gas temperature is low, the temperature of the wall in the laser chamber is also low. Therefore, it is deemed that chemical species having particularly large intermolecular forces are adsorbed on the metal or the like constituting the wall. One example of such chemical species is HF (produced by the reaction of impurities such as water ($H_2O$) in the laser chamber with fluorine in the laser gas), which has a boiling point in the neighborhood of room temperature. When a slight amount of Xe is introduced into such an environment, a part of the introduced Xe combines weakly with the chemical species adsorbed on the laser chamber wall and is captured on the laser chamber wall. It is deemed that the compound composed of Xe and other chemical species does not completely release Xe into the laser gas even if the temperature rises (a part of the Xe will be released). Therefore, the increase in the laser output weakens for the same reasons as the foregoing mechanism.

That is, a part of Xe added to the laser gas that did not form a compound which does not completely release Xe into the laser gas even if the temperature is raised as stated above is hardly adsorbed on or desorbed from the laser chamber wall after the laser gas temperature has been raised.

Therefore, the Xe concentration becomes stabilized. However, Xe forming the above-described compound causes the Xe concentration to become unstable by desorption from the laser chamber wall. Accordingly, the instability of the Xe concentration remains, although the concentration of Xe in the laser gas is stable in comparison to a case where the laser gas temperature is not raised.

On the other hand, in a state where the laser gas temperature is high, the temperature of the wall in the laser chamber is also high. Therefore, it is deemed that chemical species adsorbed on the laser chamber wall at low temperature have also been desorbed. If a slight amount of Xe is introduced into such an environment, collisions between Xe and chemical species, which were present on the laser chamber wall at low temperature, take place in a gas phase. In this case, it is deemed impossible for Xe to form a compound that may be adsorbed on the wall. Therefore, there is substantially no Xe that may be desorbed from the wall by electric discharge. Thus, the concentration of Xe in the gas becomes stabilized.

For the reasons stated above, it is deemed preferable to add a predetermined amount of Xe in a state where the gas temperature has been raised in advance.

Incidentally, the use of a premixed laser gas having a predetermined amount of Xe added to a conventional laser gas in advance is in the mainstream in the present state of the art. Therefore, if the temperature of the inner wall of the laser chamber has been raised in advance, it is possible to obtain the same effect as that obtained by adding Xe after the laser gas temperature has been raised.

Figure 12:
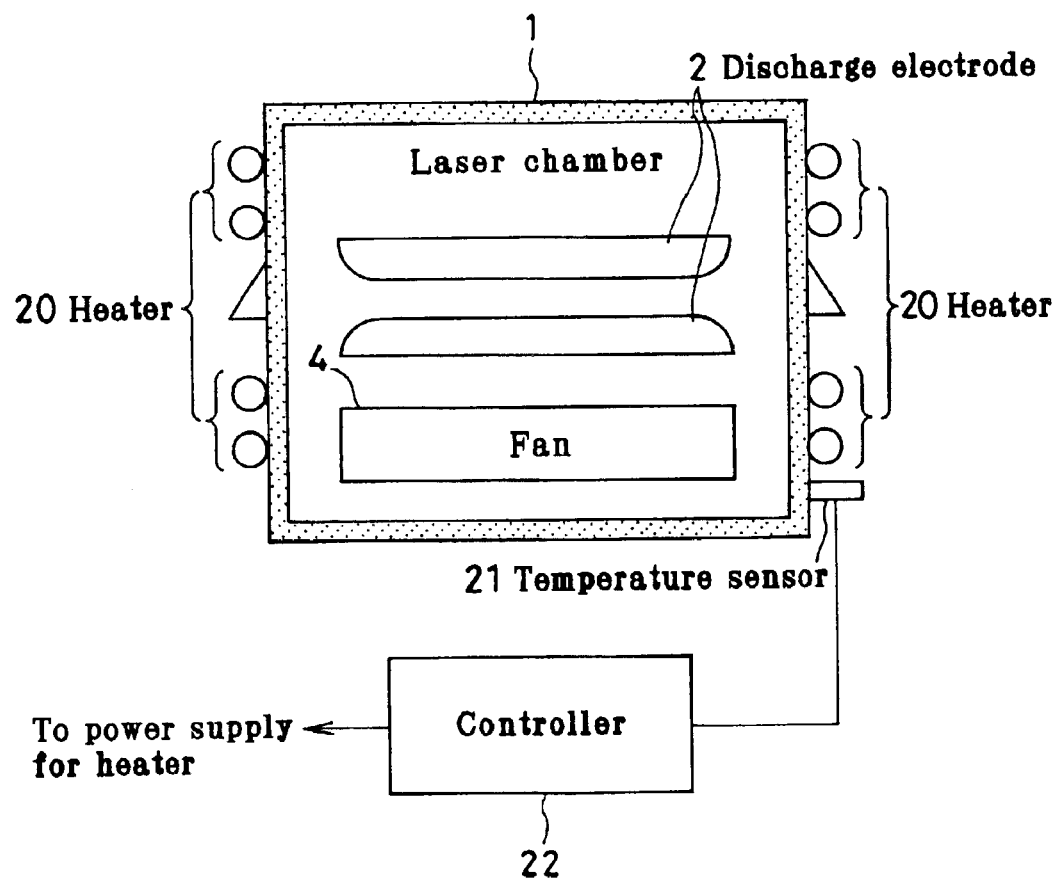
FIG. 12 is a diagram for describing an example of a laser chamber heating mechanism and a temperature control mechanism.

The above-described effects can also be provided by bringing a heat source into contact with the chamber to thereby maintain the chamber at an optimum temperature of not less than 35° C. For example, as shown in FIG. 12, a heater 20 as a heat source is placed in contact with the outer surface of the laser chamber 1. The temperature of the laser chamber 1 is measured with a temperature sensor 21 installed on the outer surface of the laser chamber 1. Temperature data thus obtained is sent to a controller 22. The controller 22 instructs a power supply (not shown) for the heater 20 to control the supply of electric power to the heater 20 so that the temperature of the laser chamber 1 is at 35° C. or more. The upper limit of the temperature of the laser chamber 1 is appropriately set by taking into consideration the heat resistance of the seal portion of the laser chamber 1 and laser components in the vicinity of the laser chamber 1 and so forth.

It should be noted that the temperature sensor 21 may be disposed on the outer surface of the laser chamber 1 as stated above. Alternatively, the temperature sensor 21 may be disposed in the laser chamber 1 to measure the temperature of the inner wall of the laser chamber 1 directly. In a case where the temperature sensor 21 is disposed on the outer surface of the laser chamber 1, it is desirable that the preset temperature be not less than 40° C. or not less than 45° C., for example, because there may be a temperature difference between the outer surface of the laser chamber 1 and the inner wall surface thereof according to the thermal conductivity of the laser chamber 1.

Although the gas laser apparatus for lithography according to the present invention has been described above on the basis of the embodiments, the present invention is not limited to the foregoing embodiments but can be modified in a variety of ways.

As will be clear from the foregoing description, according to the present invention, in a gas laser apparatus for lithography adapted to stretch the pulse width, the temperature of a laser gas containing a slight amount of Xe is raised, whereby it becomes possible to increase the laser output and stability in the second half of each laser pulse. Thus, the laser pulse width is further stretched, and a reduction in the peak power and narrowing of the bandwidth are realized. In addition, the laser oscillation efficiency is improved. Therefore, the chamber lifetime is extended owing to the reduction in the input energy, and the laser operating cost is reduced. Further, because the energy in the second half of each laser pulse is stabilized, energy stability per pulse is improved, and exposure dose controllability is also improved. The effects are particularly enhanced by adding Xe after the gas temperature has been raised, or by introducing a laser gas containing a slight amount of Xe after the chamber temperature has been raised.

What we claim is:

1. A gas laser apparatus for lithography having a pair of discharge electrodes for excitation provided in a laser chamber having a laser gas sealed therein and emitting laser beam having a laser pulse width ($T_{is}$) of not less than 40 ns, said gas laser apparatus comprising:

a temperature sensor for measuring a temperature of the laser chamber;

a heater for heating the laser chamber; and a controller for controlling the heater on a basis of data from the temperature sensor to heat the laser gas to not less than 35° C.;

wherein the laser gas contains xenon.

2. A method for providing a gas laser apparatus for lithography having a pair of discharge electrodes for excitation provided in a laser chamber having a laser gas sealed therein and emitting laser beam having a laser pulse width ($T_{is}$) of not less than 40 ns, comprising setting a temperature of the laser gas before addition of xenon to not less than, 35° C., and adding xenon to the laser gas at not less than 35° C. in an amount not less than 2 ppm and not more than 100 ppm in partial pressure ratio.

3. A method for providing a gas laser apparatus for lithography according to claim 2, wherein the temperature of the laser gas before addition of xenon is not less than 40° C., and xenon is added to the laser gas in an amount not less than 2 ppm and not more than 100 ppm in partial pressure ratio.

4. A method for providing a gas laser apparatus for lithography according to claim 2, wherein the temperature of the laser gas before addition of xenon is not less than 45° C., and xenon is added to the laser gas in an amount not less than 2 ppm and not more than 100 ppm in partial pressure ratio.

5. A method for providing a gas laser apparatus for lithography having a pair of discharge electrodes for excitation provided in a laser chamber having a laser gas sealed therein and emitting laser beam having a laser pulse width (Tis) of not less than 40 ns, wherein a temperature of the laser chamber is raised to not less than 35° C. by heating, and thereafter, a laser gas containing xenon in an amount not less than 2 ppm and not more than 100 in partial pressure ratio is sealed in the laser chamber.

6. A method for providing a gas laser apparatus for lithography according to claim 5, wherein the temperature of the laser chamber is raised to not less than 40° C. by heating.

7. A method for providing a gas laser apparatus for lithography according to claim 5, wherein the temperature of the laser chamber is raised to not less than 45° C. by heating.

8. A method for providing a gas laser apparatus for lithography having a pair of discharge electrodes for excitation provided in a laser chamber having a laser gas sealed therein and emitting laser beam having a laser pulse width (Tis) of not less than 40 ns, comprising adding xenon to said laser gas in an amount not less than 2 ppm and not more than 100 ppm in partial pressure ratio, and setting a temperature of the laser gas after addition of the xenon at not less than 35° C.

9. A method for providing a gas laser apparatus for lithography according to claim 8, wherein the temperature of the laser gas after addition of the xenon is not less than 40° C.

10. A method for providing a gas laser apparatus for lithography according to claim 8, wherein the temperature of the laser gas after addition of the xenon is not less than 45° C.

11. A method for providing a gas laser apparatus for lithography comprising providing a pair of discharge electrodes provided in a laser chamber and emitting laser beam having a laser pulse width ($T_{is}$) of not less than 40 ns by exciting a laser gas sealed in said laser chamber by electric discharge between said pair of discharge electrodes, said laser gas containing xenon in an amount not less than 2 ppm and not more than 100 ppm in partial pressure ratio, wherein said laser gas has been heated to not less than 35° C. when said laser beam is emitted.

12. A method for providing a gas laser apparatus for lithography according to claim 11, further comprising providing preionization means for preionizing said laser gas.

13. A method for providing a gas laser apparatus for lithography according to claim 11 or 12, wherein said laser gas has been heated to not less than 40° C. when said laser beam is emitted.

14. A method for providing a gas laser apparatus for lithography according to claim 11 or 12, wherein said laser gas has been heated to not less than 45° C. when said laser beam is emitted.

15. A method for providing a gas laser apparatus for lithography according to any one of claims 2, 5, 8 or 11, which is arranged to perform a laser oscillating operation by a first half-cycle of a discharge oscillating current waveform of one pulse in which a polarity is reversed, together with at least two half-cycles subsequent to the first half-cycle.

16. A method for providing a gas laser apparatus for lithography according to any one of claims 2, 5, 8 or 11, wherein said gas laser is one selected from a KrF excimer laser apparatus, an ArF excimer laser apparatus, and a fluorine laser apparatus.

* * * * *